(12) United States Patent
Kim et al.

(10) Patent No.: US 7,045,385 B2
(45) Date of Patent: May 16, 2006

(54) METHOD FOR FABRICATING SURFACE ACOUSTIC WAVE FILTER PACKAGES AND PACKAGE SHEET USED THEREIN

(75) Inventors: Tae Hoon Kim, Kyungki-do (KR); Ju Weon Seo, Seoul (KR); Joo Hun Park, Kyungki-do (KR); Moon Soo Jeon, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 129 days.

(21) Appl. No.: 10/713,028

(22) Filed: Nov. 17, 2003

(65) Prior Publication Data

US 2005/0042804 A1 Feb. 24, 2005

(30) Foreign Application Priority Data

Aug. 20, 2003 (KR) ...................... 10-2003-0057496

(51) Int. Cl.
*H01L 21/44* (2006.01)

(52) U.S. Cl. ...................... 438/106; 438/114; 438/115; 438/113; 438/110; 257/659; 257/660

(58) Field of Classification Search ........ 438/106–107, 438/110, 113–115; 257/659
See application file for complete search history.

(56) References Cited

U.S. PATENT DOCUMENTS

| 5,523,641 | A | * | 6/1996 | Yatsuda et al. | ......... 310/313 R |
| 5,699,027 | A | * | 12/1997 | Tsuji et al. | .................. 333/193 |
| 6,154,940 | A | * | 12/2000 | Onishi et al. | ............... 29/25.35 |
| 6,287,894 | B1 | * | 9/2001 | Sawin | ......................... 438/113 |
| 6,492,194 | B1 | * | 12/2002 | Bureau et al. | ................ 438/106 |
| 6,649,446 | B1 | * | 11/2003 | Goetz et al. | ................ 438/110 |
| 6,815,869 | B1 | * | 11/2004 | Baba et al. | ............. 310/313 R |
| 2003/0109077 | A1 | * | 6/2003 | Kim et al. | ................... 438/106 |

FOREIGN PATENT DOCUMENTS

KR  10-2003-0001880 A  1/2003
KR  10-2003-0046940 A  6/2003

* cited by examiner

*Primary Examiner*—Luan Thai
(74) *Attorney, Agent, or Firm*—Lowe Hauptman & Berner, LLP (57) ABSTRACT

A method for fabricating Surface Acoustic Wave filter packages uses a package sheet having an outline pattern and anti-bur holes. In the package sheet for a Surface Acoustic Wave filter package, the outline pattern is formed along outer peripheries of chip mounting areas where a plurality of SAW filter chips are to be mounted. The outline pattern is contacted with a metal shield layer formed on the SAW filter chips and a predetermined region of the package sheet. Circular anti-bur holes are located at the corners of the chip mounting areas and on cutting lines along which the sheet is to be singulated into individual SAW filter packages.

11 Claims, 6 Drawing Sheets

PRIOR ART

FIG. 1

PRIOR ART

PRIOR ART

METHOD FOR FABRICATING SURFACE ACOUSTIC WAVE FILTER PACKAGES AND PACKAGE SHEET USED THEREIN

BACKGROUND OF THE INVENTION

1. Field of the Invention

The present invention relates to a method for fabricating Surface Acoustic Wave filter packages and a package sheet used therein, and more particularly, to a method for fabricating Surface Acoustic Wave (hereinafter will be referred to as 'SAW') filter packages using a package sheet having an outline pattern and anti-bur holes and a package sheet used therein.

2. Description of the Related Art

SAW filters are key parts for processing frequency signals in various frequency bands up to GHz bands. In particular, the SAW filters are more widely used for RF mobile communication based upon their excellent characteristics such as mass productivity, selectivity and stability.

The SAW filters are gradually getting reduced in their sizes. Accordingly, recently a Chip Size Package type SAW filter is produced. (Hereinafter Chip Size Package will be referred to as 'CSP'.)

Figure 1:
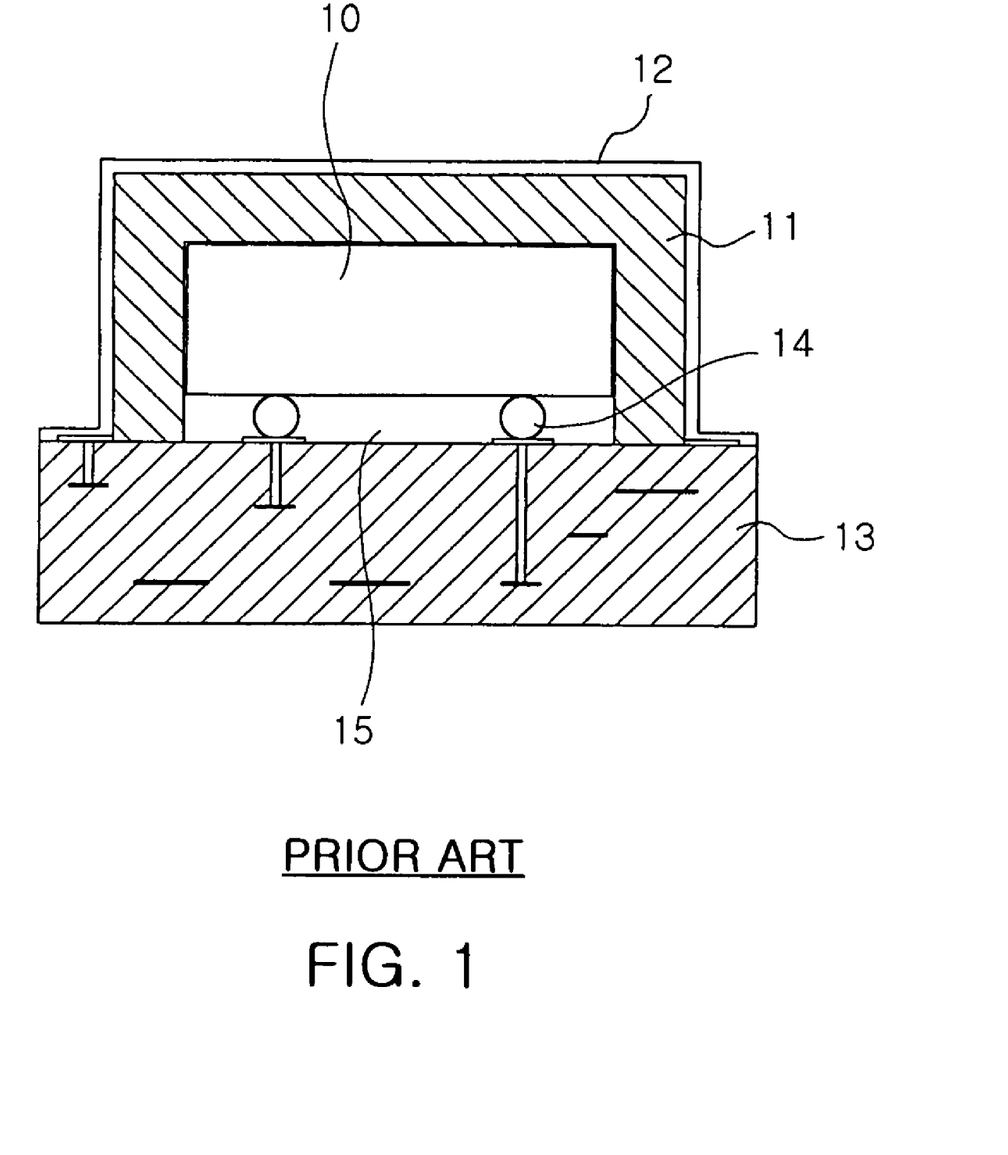
FIG. 1 is a sectional view of an SAW filter package.

In a CSP, as shown in FIG. 1, an SAW filter chip 10 is placed on a package sheet 13, electrically connected via bumps 14. The SAW filter chip 10 attached to the package sheet 13 has a protective layer 11 formed of a resin and a metal shield 12 covered on the protective layer 11.

FIGS. 2a through 2f illustrate a conventional process for fabricating CSP SAW filter packages.

Figure 2:
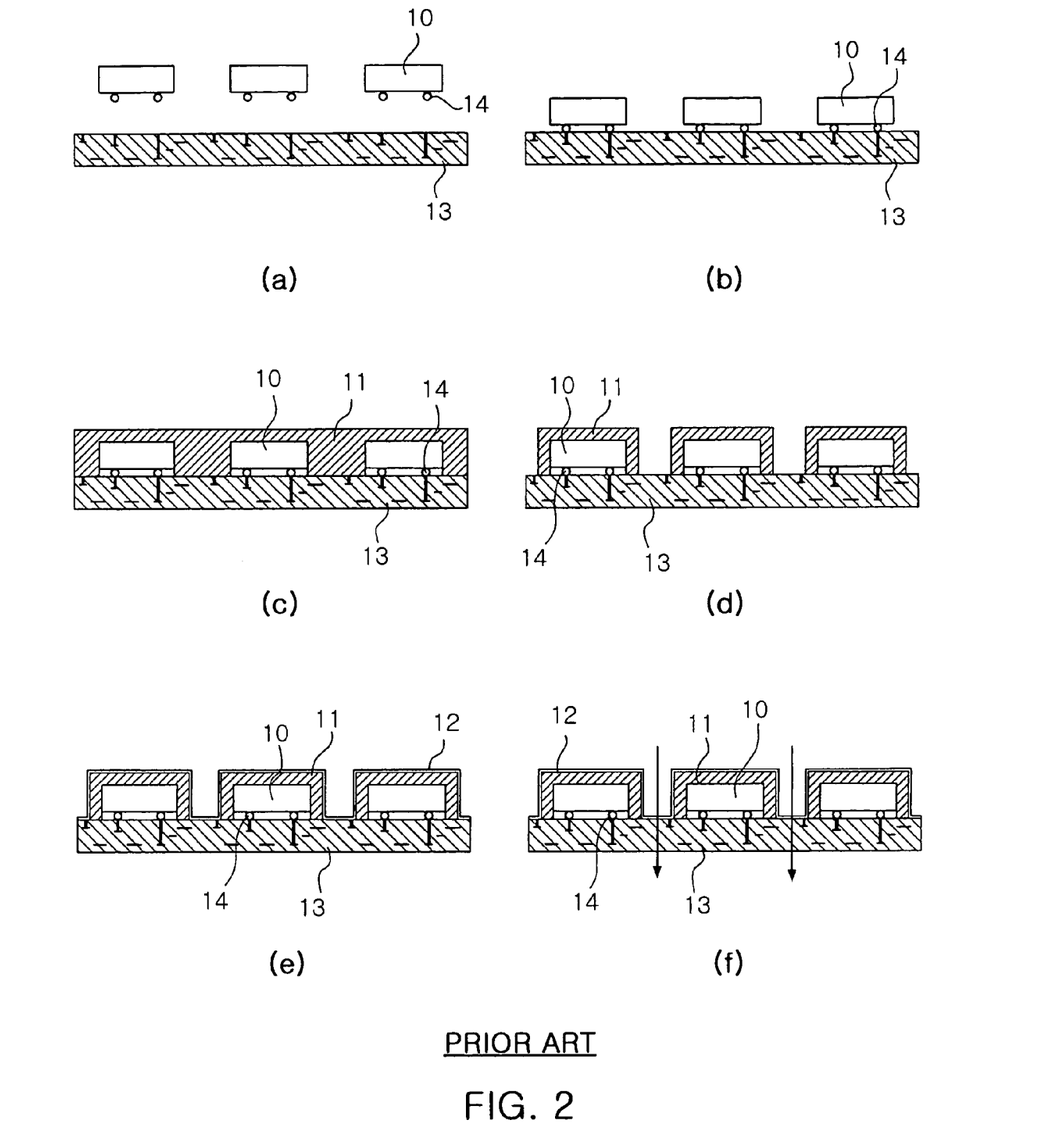
FIGS. 2a through 2f illustrate a conventional process for fabricating CSP SAW filter packages.

As shown in FIG. 2a, a plurality of SAW filter chips 10 are prepared together with a package sheet or substrate 13, and bumps 14 are provided on undersides of the SAW filter chips 10 for mounting the SAW filter chips 10 on the substrate 13.

The SAW filter chips 10 are attached on the substrate. The SAW filter chips 10 are spaced from one another at a predetermined distance so that the SAW filter chips 10 can be separated into respective packages (FIG. 2b).

A protective layer 11 made of a resin is covered on and filled between the chips 10 on the substrate 13. Examples of the resin may include a thermosetting resin or a photosensitive film. The protective layer 11 allows the SAW filter chips 10 to be in contact with the underlying substrate 13, and also functions to maintain air layers under the SAW filter chips 10 (FIG. 2c).

The protective layer 11 is removed, for example, grooved from predetermined regions of the substrate 13 along which the sheet 13 will be cut into respective packages. This grooving procedure can be performed through a mechanical process to dig the predetermined regions of the substrate 13 to a predetermined depth. Alternatively, a photo-processing such as exposure can be used to remove predetermined regions of the photosensitive resin (FIG. 2d).

Upon completion of the grooving, a metal shield 12 is formed on outer contours of the SAW filter chips 10. The metal shield 12 is formed in the form of at least two metal shield layers through plating in order to screen external noises as well as promote reliability against external environment (FIG. 2e).

The substrate is diced in order to separate the SAW filter chips 10 covered with the metal shield 12 into the respective packages (FIG. 2f).

Figure 3:
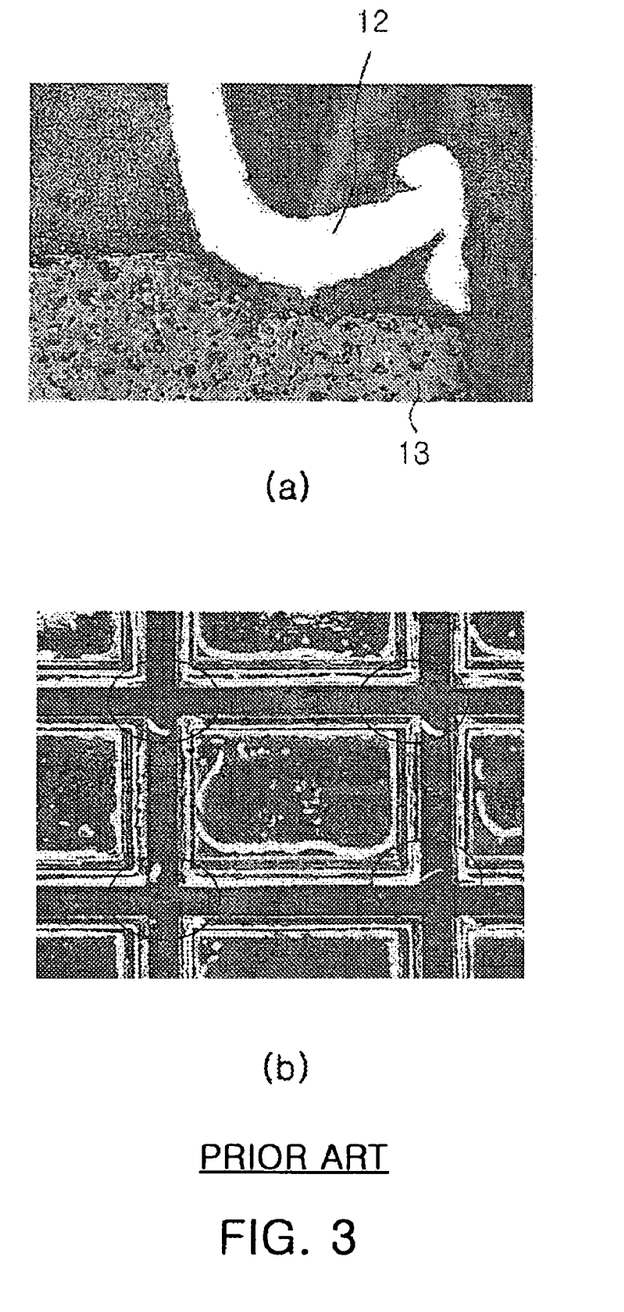
FIG. 3a is a photograph illustrating separation of a metal shield from a sheet in a conventional SAW filter package.
FIG. 3b is a photograph illustrating burs in a conventional SAW filter package.

In the conventional process for fabricating SAW filter packages, the metal shield layer is formed on outer faces of the SAW filter chips and outer face portions of the package sheet. The shield layer is made of metal, whereas the SAW filters and the substrate are made of non-metal. In particular, because the substrate is made of ceramic, the bonding force maintaining these two materials adhered together is lowered. As a result, the shield layer may be separated or delaminated from the substrate during a package-cutting process thereby heavily degrading the reliability of a product. Such delamination is shown in FIG. 3a, in which the metal shield 12 is separated from the substrate 13.

Further, the substrate is grooved to expose the terminals of the substrate for the purpose of grounding the SAW package through the shield layer. However, if the chip is not correctly aligned with the pattern of the substrate, the SAW package is not grounded, thereby lowering the quality and reliability of the product.

Moreover, since the shield layer of the SAW package contains very soft Cu as its main component, the problem of burs, that is, metal fragments from metal shield during dicing can be caused. The burs are mainly produced at corners of the package as shown in FIG. 3b. The burs are produced in lateral and longitudinal cutting processes and may cause severe problem in mounting, storage and reliability of package.

SUMMARY OF THE INVENTION

The present invention has been made to solve the foregoing problems and it is therefore an object of the present invention to provide a method for fabricating SAW packages and a package sheet used therein, which can prevent any delamination in a shield layer, chips and a sheet to enhance the reliability of a product while preventing defects.

It is another object of the invention to provide a package sheet and a method for fabricating SAW packages using the package sheet, which can reliably connect ground terminals of the package sheet with a shield layer as well as prevent burs in a package during fabrication of the package.

According to an aspect of the invention for realizing the object, there is provided a method for fabricating Surface Acoustic Wave filter packages, the method comprising the following steps of: preparing a plurality of SAW filter chips and a package sheet, wherein the package sheet has an outline pattern of a predetermined width formed along outer peripheries of predetermined chip mounting areas and circular anti-bur holes formed at corners of the mounting areas to be mounted with the SAW filter chips; mounting the SAW filter chips on the package sheet; forming a protective layer on the SAW filter chips on the package sheet; removing predetermined portions of the protective layer between the SAW filter chips to expose the outline pattern on the package sheet and predetermined portions of the package sheet between the SAW filter chips; forming a metal shield layer on the SAW filter chips, the exposed portions of the package sheet and the outline pattern; and cutting the package sheet along predetermined cutting lines extended through the anti-but holes between the SAW filter chips to form a plurality of SAW filter packages.

It is preferred that the outline pattern is formed on the package sheet with a predetermined length corresponding to the outer peripheries of the SAW filter chips.

It is also preferred that each of the anti-bur holes has a predetermined size to cover all adjacent corners of corresponding mounting areas.

It is preferred that the package sheet comprises at least two sheet layers, and more preferably, the anti-bur holes are formed in at least one sheet layer of the at least two sheet layers, the one sheet layer having a surface for mounting the SAW filter chips.

It is preferred that the SAW filter chips are provided on undersides with bumps for mounting the SAW filter chips.

It is also preferred that the protective layer comprises a photosensitive film, and more preferably, the step of removing predetermined portions of the protective layer is carried out by dry etching.

According to another aspect of the invention for realizing the object, there is provided a package sheet for a Surface Acoustic Wave filter package comprising: an outline pattern formed along outer peripheries of predetermined areas to be mounted with a plurality of SAW filter chips, the outline pattern being contacted with a metal shield layer formed on the SAW filter chips and a predetermined region of the package sheet; and circular anti-bur holes covering corners of the chip mounting areas to be mounted with the SAW filter chips and intersected by cutting lines functioning as reference lines for cutting the sheet into a plurality of SAW filter packages.

It is preferred that the outline pattern is formed in the package sheet with a length corresponding to the outer peripheries of the SAW filter chips.

It is preferred that each of the anti-bur holes has a predetermined size to cover all adjacent corners of corresponding mounting areas.

It is also preferred that the package sheet comprises at least two sheet layers, and more preferably, the anti-bur holes are formed in at least one sheet layer of the at least two sheet layers, the one sheet layer having a surface for mounting the SAW filter chips.

According to further another aspect of the invention for realizing the object, there is provided a Surface Acoustic Wave filter fabricated according to the method as set forth in the foregoing method for fabricating Surface Acoustic Wave filter packages.

According to still another aspect of the invention for realizing the object, there is provided a Surface Acoustic Wave filter fabricated using the foregoing package sheet.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Hereinafter, a preferred embodiment of the present invention will be described in detail with reference to the attached drawings.

Figure 4:
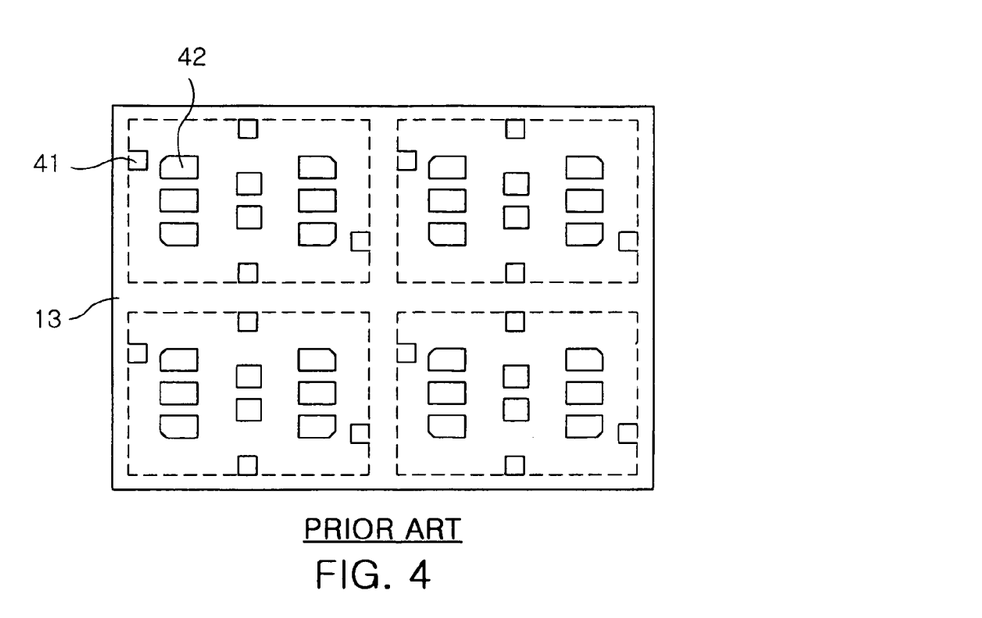
FIG. 4 illustrates a conventional package sheet for SAW filter packages.
Figure 5:
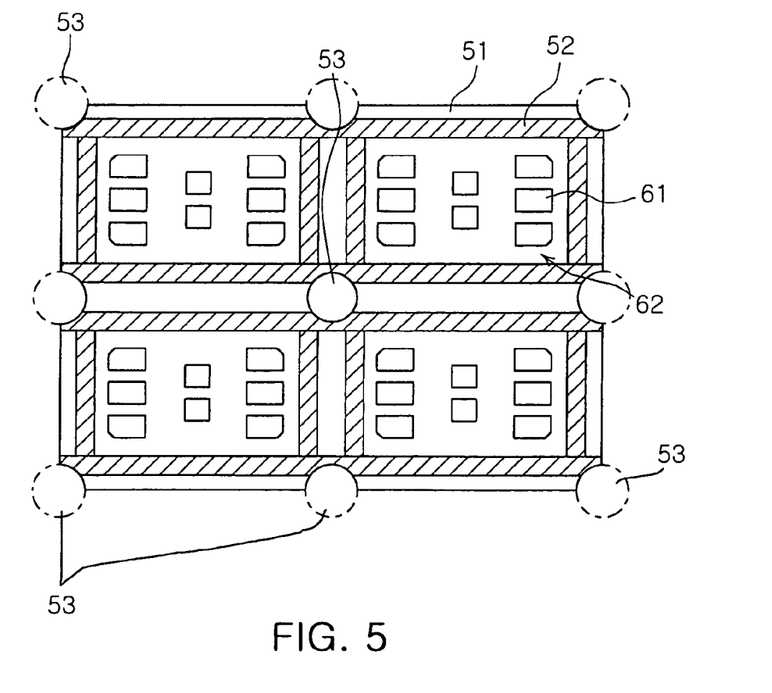
FIG. 5 illustrates a package sheet for SAW filter packages of the invention.

A SAW filter package of the present invention is fabricated by using a package sheet shown in FIG. 5. The package sheet 51 in FIG. 5 has a structure which is different from that of a package sheet 13 (FIG. 4) used in a conventional SAW filter package.

The conventional package sheet 13 shown in FIG. 4 is made of ceramic and serves to mount a plurality of SAW filter chips. The package sheet 13 has a plurality of terminals 42 and ground terminals 41 which are formed adjacent to outer peripheries of the SAW filter chips. Regions for the SAW filter chips are formed on the package sheet 13 so that respective SAW filter chips are spaced from one another at a predetermined distance.

FIG. 5 illustrates a package sheet for SAW filter packages of the present invention. Likewise to the conventional package sheet, the package sheet 51 of the present invention comprises predetermined mounting areas 62 to be mounted with a plurality of SAW filter chips, spaced from one another at a predetermined distance, and terminals 61 formed in the mounting areas 62 to be connected with terminals in the SAW filter chips.

Instead of conventional ground terminals, the package sheet of the invention comprises an outline pattern 52 including a ground pattern. The outline pattern 52 is formed at a predetermined width along outlines of the mounting regions 62 on which the SAW filter chips will be mounted. As shown in FIG. 5, the outline pattern 52 defines rectangular peripheries at a width which is substantially same as or slightly larger than that of the conventional ground terminals. The outline pattern 52 is printed on the ceramic sheet 51. The outline pattern 52 is connected with a shield layer which is formed on a package sheet as will be described later.

The package sheet 51 of the invention further comprises circular anti-bur holes 53 formed in corner portions of the mounting areas 62 in order to prevent creation of burs since the burs are conventionally produced while the package sheet 51 is diced into respective packages upon completion of mounting the SAW filter chips on the package sheet 51.

As shown in FIG. 5, the anti-bur holes 53 are formed at corners of the SAW filter chip-mounting areas 62 where edges of each mounting area meet together, being overlapped with the corners. Therefore, the anti-bur holes form concave recesses at the corners of the SAW filter chip-mounting areas 62. This structure of the anti-bur holes 53 can prevent creation of the burs at the corners during dicing.

The package sheet 51 of the invention may comprise at least two sheet layers. That is, a plurality of thin ceramic sheet layers are stacked one atop another to form a laminated sheet. In this fashion, circuit elements can be formed respectively in the sheet layers.

Further, the anti-bur holes 53 are preferably formed in at least one of the at least two sheet layers. In particular, the anti-bur holes 53 can be formed in at least one sheet layer including an uppermost face thereof on which the SAW filter chips will be mounted. As a result, the anti-bur holes 53 may be formed in the upper sheet layer of the package sheet, or extended through the entire sheet layers of the package sheet.

The following description will discuss a method for fabricating SAW filter packages using the package sheet 51 of the invention with reference to FIGS. 6a through 6f. FIGS. 6a through 6f illustrate a process for fabricating SAW filter packages of the invention.

Figure 6:
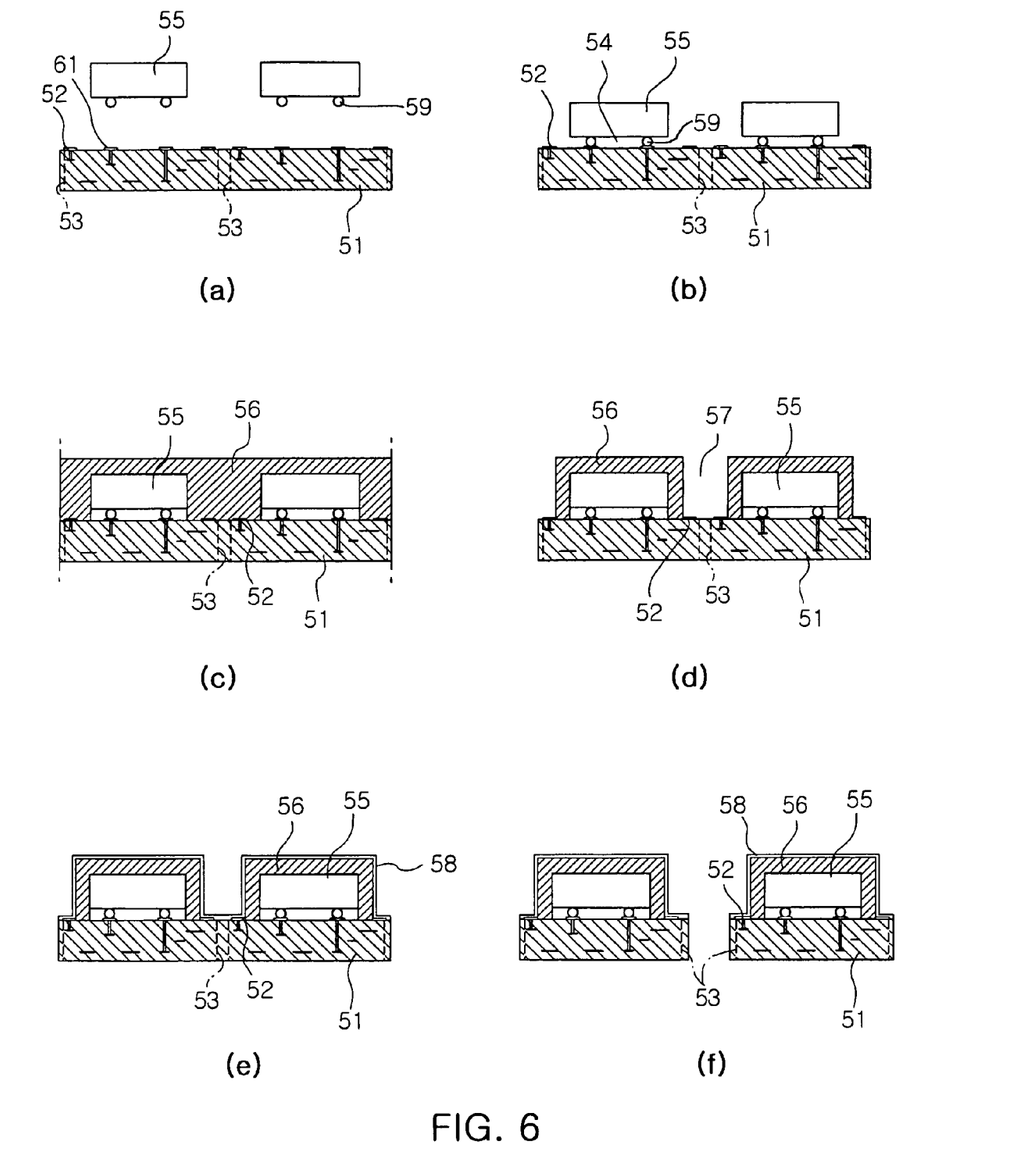
FIGS. 6a through 6f illustrate a process for fabricating CSP SAW filter packages of the invention.

(a) Preparing SAW Filter Chips

SAW filter chips 55 are formed respectively by cutting for example a wafer into pieces. A package sheet 51 is also prepared to mount the SAW filter chips 55.

The package sheet 51 is typically in the form of a ceramic substrate which is formed by stacking a plurality of ceramic sheet layers one atop another. The terminals 61 are formed on an upper face of the package sheet 51 for electric connection with the SAW filter chips 55. Terminals 61 of the package sheet 51 are connected via bumps 59 made of lead and so on. Bumps 59 form air layers between undersides of the SAW filter chips 55 and the sheet 51. Low density air layers are necessary between the chips and the sheet since SAW filters use surface acoustic wave. The bumps are formed on the undersides of the chips in order to form the low density air layers. Alternatively, the sheet may be provided with solder bumps, and protectors may be mounted on undersides of the chips to form low density air areas.

An outline pattern 52 is formed on the package sheet 51 at the predetermined width along the outer peripheries of the chips 55. The outline pattern 52 is formed around the chips including those areas for forming the conventional ground terminals, and defines rectangular peripheries of the areas in this embodiment. The outline pattern 52 is made of an alloy such as Au and Ni, similar to a material of a shield layer which will be described later.

The package sheet 51 is also provided with a plurality of circular anti-bur holes 53 as shown in FIG. 5. The anti-bur holes 53 are preferably formed around predetermined points at which cutting lines to be drawn between the chip-mounting areas meet together. The anti-bur holes 53 have a size large enough to cover the corners of the outline patterns.

(b) Mounting the SAW Filter Chips on the Package Sheet

The SAW filter chips 55 prepared in the step (a) are mounted on predetermined positions of the package sheet 51. The bumps 59 form air layers 54 of a predetermined height between the package sheet 51 and the chips 55.

(c) Forming a Protective Layer on the SAW Filter Chips on the Package Sheet

Upon mounting the SAW filter chips 55 on the package sheet 51 as above, a protective layer 56 is formed on the SAW filter chips 55.

The protective layer 56 is filled between the chips 55 as shown in FIG. 6c. The protective layer 56 may be formed of for example a photosensitive film. The photosensitive film is a kind of high molecular compound having a property that a portion of the compound changes its structure when exposed to light or radioactive radiation. Available examples thereof may include a photoresist, photosensitive polyimide and photosensitive dry film. The photosensitive film is used to form a pattern on an Integrated Circuit (LC), a Large Scale Integration (LSI) circuit, a Printed Circuit Board (PCB) and so on. In order to form the protective layer, a thin film is placed on the chips and then pushed into apertures between the chips with a pressing means such as a roller. The protective layer 56 is filled between the chips 55 through the above process. The protective layer 56 also contacts the outline pattern 52 formed on the package sheet 51.

(d) Removing the Protective Layer Portions Between the SAW Filter Chips to Expose the Outline Pattern and Package Sheet Portions Between the SAW Filter Chips.

When the protective layer 56 is filled between the chips 55 in the step (c), the protective layer is removed except for predetermined portions thereof which surround the chips at a predetermined thickness in order to form a metal shield layer on the SAW filter packages.

As shown in FIG. 6d, the protective layer is removed from above cutting areas 57 between the chips. When the protective layer is made of a photosensitive film, the protective layer is removed by a developer or through dry etching. The developer removes portions of the protective layer which are not exposed to light. In dry etching, predetermined portions of the protective layer are removed when exposed to plasma, reactant gas such as Ar and $O_2$ or light such as laser.

Upper face portions of the package sheet 51 and the outline pattern 52 formed on the package sheet 51 are exposed through the removed portions. In removing the protective layer to expose these parts, the width of the removed area is adjusted so that remaining portions of the protective layer surround contours of the SAW filter chips in predetermined thickness.

(e) Forming the Metal Shield Layer on the SAW Filter Chips, the Exposed Portions of Package Sheet and the Outline Pattern When the portions of the protective layer between the chips are removed to expose a part of the package sheet face and the outline pattern, the metal shield layer is formed on outer face portions of the chips, the exposed portions of the package sheet and the outline pattern.

The metal shield layer is formed to minimize any external influence to the SAW filter chips, and electrically connected with the outline pattern 52 of the package sheet 51. Also, the metal shield layer 58 is made of a material similar to that of the outline pattern 52 of the package sheet 52. That is, the shield layer typically contains Ni, Cu and so on, and the outline pattern typically contains Ni and Au. This similarity in material makes the affinity between these two materials excellent and the coefficient of thermal expansion substantially same. As a result, the metal shield layer 58 is tightly attached to the outline pattern 52 on the package sheet.

The SAW filter package of the invention can advantageously prevent separation of the metal shield layer from the package sheet which was observed in the conventional SAW filter package having the conventional metal shield layer directly contacted with the ceramic package sheet.

Further, the SAW filter package of the invention increases the area of the terminals to be contacted with the shield layer by large amounts compared with the conventional SAW filter package. That is, since the outline pattern is formed on the package sheet along the outer peripheries of the SAW filter chips, the SAW filter chips are sufficiently grounded if only a portion of the outline pattern is contacted with the shield layer. As a result, this structure can ensure reliable contact between the outline pattern and the shield layer.

Moreover, the SAW filter chips may be misaligned during mounting on the package sheet or in a following connecting process. There are conventional problems that this misalignment obstructs the shield layer from contacting the terminals on the sheet. However, as the outline pattern of the invention is formed widely along the peripheries of the chips, there is an advantage that the shield layer can constantly contact the outline pattern even if the shield layer and the outline pattern are slightly misaligned.

(f) Cutting the Package Sheet Along Lines Extended Through the Anti-Bur Holes Between the SAW Filters to Form SAW Filter Packages After the shield layer is formed on the counters of the SAW filter chips as above, the package sheet mounted with the SAW filter chips is cut into the respective SAW filter packages. The packages are separated through mechanical cutting. The circular anti-bur holes 53 are formed in the package sheet to prevent creation of any burs at the corners of the respective rectangular packages during the cutting process.

The anti-bur holes 53 are formed at the corners of the SAW filter chip-mounting areas 62 where edges of each mounting area meet together, being overlapped with the corners. Therefore, concave recesses are formed by anti-bur holes at the corners of the SAW filter chip-mounting areas 62 as shown in FIG. 5. This structure of the anti-bur holes 53 can prevent creation of the burs at the corners during dicing.

Figure 7:
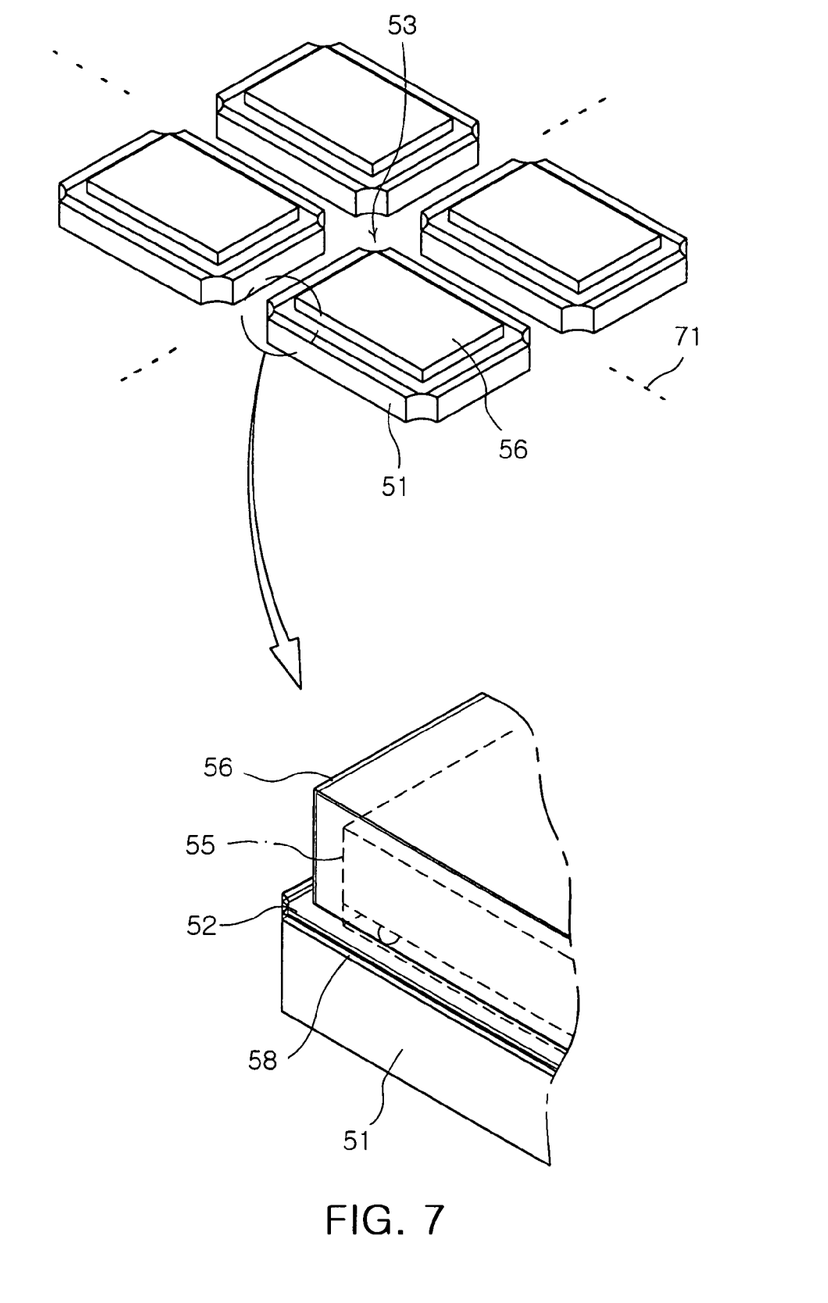
FIG. 7 is a perspective view illustrating edges of an SAW filter package of the invention which is cut from other SAW filter packages.

FIG. 7 is a perspective view illustrating edges of an SAW filter package of the invention which is cut from other SAW filter packages. The respective SAW filter packages are separated as shown in FIG. 7, in which the anti-bur holes 53 are shown in a region where the cutting lines 71 meet together.

As set forth above, the present invention forms the outline pattern on the package sheet of the same material as that of the shield layer of the SAW filter package so that the outline pattern is contacted and tightly attached with the shield layer, thereby preventing creation of any delamination between the shield layer and the chip or the sheet.

Further, the invention forms the outline pattern of the package sheet around the outer periphery of the SAW filter chip in order to ensure reliable contact between the shield layer and the outline pattern of the SAW filter package even if the filter chip is misaligned.

Moreover, the invention forms the anti-bur holes in the package sheet thereby preventing burs in fabrication of the SAW filter package.

Although the preferred embodiment of the present invention has been disclosed for illustrative purposes, those skilled in the art will appreciate that various modifications, additions and substitutions can be made without departing from the scope and spirit of the invention as disclosed in the accompanying claims.

What is claimed is:

1. A method of fabricating Surface Acoustic Wave (SAW) filter packages, the method comprising the steps of:
    preparing a plurality of SAW filter chips and a package sheet, wherein the package sheet has
        an outline pattern of a predetermined width formed along outer peripheries of predetermined chip mounting areas where the SAW filter chips are to be mounted, and
        circular anti-bur holes formed at corners of the chip mounting areas;
    mounting the SAW filter chips on the package sheet;
    forming a protective layer on the SAW filter chips on the package sheet;
    removing predetermined portions of the protective layer between the SAW filter chips to expose the outline pattern on the package sheet and predetermined portions of the package sheet between the SAW filter chips;
    forming a metal shield layer on the SAW filter chips, the exposed portions of the package sheet and the outline pattern; and
    cutting the package sheet along predetermined cutting lines extending through the anti-bur holes between the SAW filter chips to form a plurality of SAW filter packages.

2. The method as set forth in claim 1, wherein the outline pattern is formed on the package sheet with a predetermined length corresponding to the outer peripheries of the SAW filter chips.

3. The method as set forth in claim 1, wherein each of the anti-bur holes has a predetermined size to cover all adjacent corners of the corresponding chip mounting areas.

4. The method as set forth in claim 1, wherein the package sheet comprises at least two sheet layers.

5. The method as set forth in claim 4, wherein the anti-bur holes are formed in at least one sheet layer of the at least two sheet layers, the one sheet layer having a surface for mounting the SAW filter chips.

6. The method as set forth in claim 1, wherein the SAW filter chips are provided on undersides thereof with bumps for mounting the SAW filter chips.

7. The method as set forth in claim 1, wherein the protective layer comprises a photosensitive film.

8. The method as set forth in claim 7, wherein the step of removing predetermined portions of the protective layer is carried out by dry etching.

9. A Surface Acoustic Wave filter package fabricated according to the method as set forth in claim 1.

10. The method as set forth in claim 1, wherein the outline pattern has multiple concave cut-outs defined by peripheral edges of the anti-bur holes.

11. A method of fabricating Surface Acoustic Wave (SAW) filter packages, the method comprising the steps of:
    preparing a plurality of SAW filter chips and a package sheet, wherein the package sheet has
        an outline pattern of a predetermined width formed along outer peripheries of predetermined chip mounting areas where the SAW filter chips are to be mounted, and
        anti-bur holes formed at corners of the chip mounting areas;
    mounting the SAW filter chips on the package sheet;
    forming a protective layer on the SAW filter chips on the package sheet;
    removing predetermined portions of the protective layer between the SAW filter chips to expose the outline pattern on the package sheet and predetermined portions of the package sheet between the SAW filter chips;
    forming a metal shield layer on the SAW filter chips, the exposed portions of the package sheet and the outline pattern; and
    cutting the package sheet along predetermined cutting lines extending through the anti-bur holes between the SAW filter chips to form a plurality of SAW filter packages.

* * * * *